United States Patent [19]

Higashira

[11] Patent Number: 5,332,883
[45] Date of Patent: Jul. 26, 1994

[54] TEMPERATURE CONTROL SYSTEM FOR LAMP ANNEALER

[75] Inventor: Hideki Higashira, Ikoma, Japan

[73] Assignee: Koyo Seiko Co., Ltd., Osaka, Japan

[21] Appl. No.: 905,433

[22] Filed: Jun. 29, 1992

[30] Foreign Application Priority Data

Jun. 28, 1991 [JP] Japan .................. 3-158495

[51] Int. Cl.$^5$ .............................................. H05B 1/02
[52] U.S. Cl. .................... 219/492; 219/497; 219/483; 219/486; 392/411; 340/589
[58] Field of Search ............. 219/492, 497, 505, 483, 219/486, 491, 481; 392/420, 407, 411; 340/588, 589

[56] References Cited

U.S. PATENT DOCUMENTS

| | | | |
|---|---|---|---|
| 3,796,858 | 3/1974 | Cohn | 219/331 |
| 3,803,386 | 4/1974 | Rodrigues | 219/523 |
| 3,890,486 | 6/1975 | Fitzgerald | 219/523 |
| 3,895,217 | 7/1975 | Hall et al. | 219/523 |
| 3,896,289 | 7/1975 | Di Renna | 219/523 |
| 4,149,067 | 4/1979 | Jager | 219/523 |
| 4,163,145 | 7/1979 | Neff | 219/523 |
| 4,276,466 | 6/1981 | Middleman et al. | 219/523 |
| 4,354,096 | 10/1982 | Dumas | 219/523 |
| 4,378,488 | 3/1983 | Jager | 219/523 |
| 4,379,220 | 4/1983 | Middleman et al. | 219/331 |
| 4,889,973 | 12/1989 | Farinacci et al. | 219/523 |

FOREIGN PATENT DOCUMENTS 62-98722  5/1987  Japan .
62-266385  11/1987  Japan .
62-266386  11/1987  Japan .

Primary Examiner—Mark H. Paschall
Attorney, Agent, or Firm—Mason, Fenwick & Lawrence

[57] ABSTRACT

A system for controlling the temperature of a lamp annealer which system comprises a group of lamps for heating an article to be heated, a radiation thermometer for measuring the temperature of the article, and a lamp output controller for controlling the output of the lamps based on the output of the thermometer, the controller having stored therein a target temperature control pattern. The system is adapted to effect open-loop control by controlling the lamp output according to a predetermined lamp output control pattern until the thermometer reaches a specified temperature range enabling closed-loop control and not lower than the lowest temperature measurable by the thermometer, to compare the gradient of temperatures measured by the thermometer with the gradient of the target temperature control pattern to determine the ratio of the former to the latter after the output of the thermometer has reached the temperature range, to continue the open-loop control while the gradient ratio is smaller than a predetermined control change-over reference value, and to perform closed-loop control by controlling the lamp output after the gradient ratio has increased to not smaller than the reference value so that the temperature measured matches the target temperature control pattern.

4 Claims, 3 Drawing Sheets

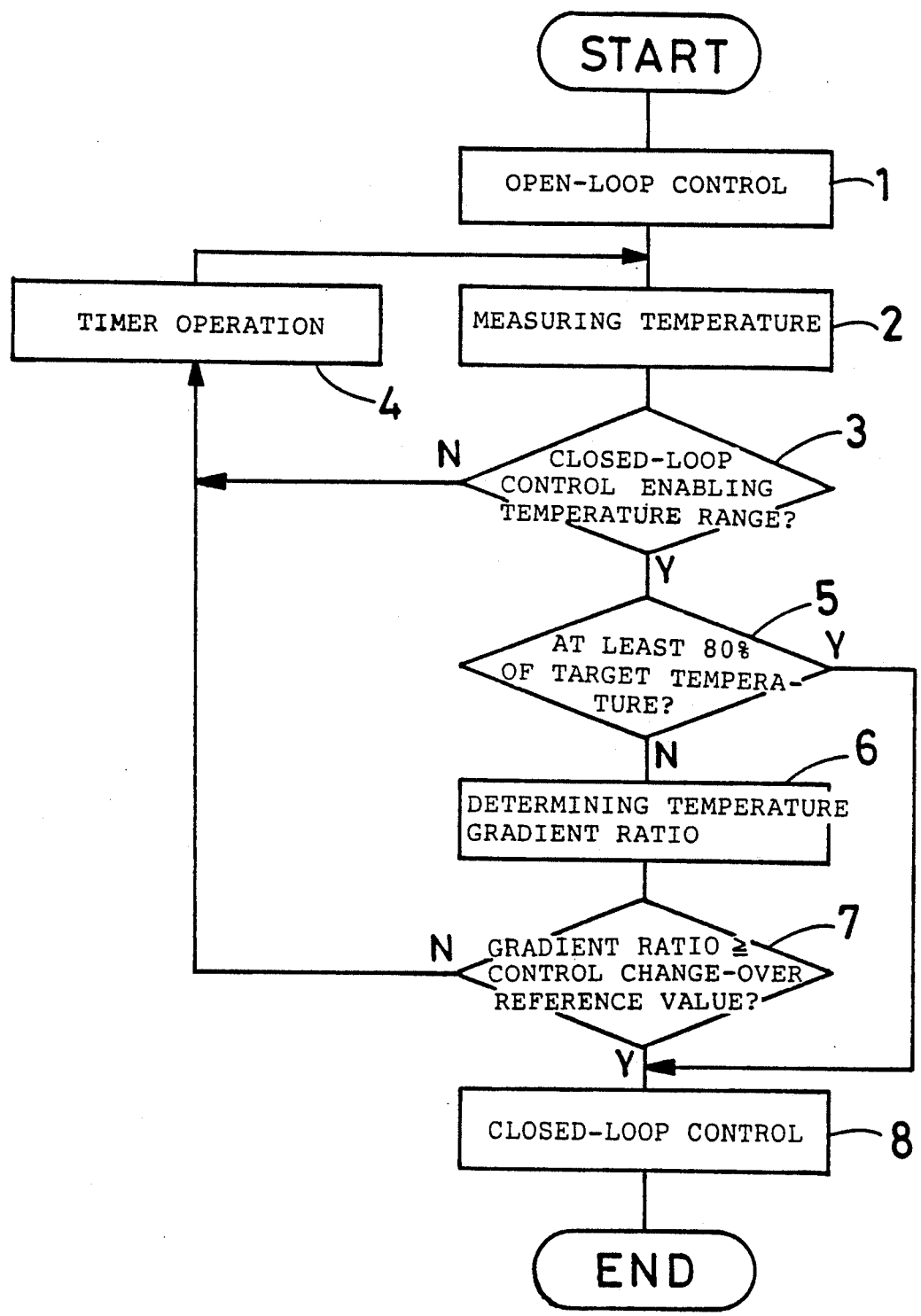

TEMPERATURE CONTROL SYSTEM FOR LAMP ANNEALER

BACKGROUND OF THE INVENTION

The present invention relates to a temperature control system for lamp annealers.

Lamp annealers are adapted to heat an article as placed, for example, in a processing tube made of quartz by irradiating the article with the light of halogen lamps, and are used, for example, for annealing semiconductor wafers.

The lamp annealer for annealing wafers are so controlled that the temperature of the wafer is in match with a predetermined target temperature control pattern. FIG. 5 shows an example of target temperature control pattern for annealing wafers. In this case, the temperature of the wafer reaches a constant temperature level of about 1000° C. which is the desired or target temperature about 8 seconds after the start of heating, and the wafer is gradually cooled about 30 seconds after the start of heating. In annealing wafers in this way, the temperature of the annealer must be controlled with high accuracy with a tolerance of not greater than ±2° C. especially at the constant temperature level.

The methods of temperature control according to such a target temperature control pattern include open-loop control and closed-loop control. In the former method, the lamp output is controlled according to a lamp output control pattern which is predetermined as by experiments. In the latter method, the lamp output is controlled while measuring the temperature of wafer with a temperature sensor so that the measured temperature will match a target temperature control pattern. These methods, however, have the following problems.

While the temperature of the wafer is dependent on the amount of energy given by the lamps, differences in the initial temperature of the processing tube and treating gas and the initial temperature and absorption factor of the wafer result in different modes of rise of temperature even if the same amount of energy is given, so that it is impossible for the open-loop method to control the wafer temperature in match with the targent temperature control pattern with good reproducibility.

In the case of closed-loop control, on the other hand, it is required to measure the wafer temperature over a wide range without a time lag, whereas conventional temperature sensors, such as thermocouples radiation thermometers, encounter difficulty in meeting this requirement. The method is therefore unable to control the wafer temperature in conformity with the target temperature control pattern. Stated more specifically, the temperature of the wafer to be annealed rises rapidly, whereas it requires some time to thermally equilibrate the thermocouple with the wafer such that the temperature rises before the thermocouple comes to thermal equilibrium with the wafer. Such a great time lag of the thermocouple behind the temperature change of the wafer presents difficulty in matching the actual wafer temperature with the target temperature control pattern. The radiation thermometer is small in time lag but is limited in measuring range, and is unable to measure temperatures of up to about 300° C. Accordingly, it is also difficult to use the radiation thermometer for closed-loop control.

To overcome these problems, a temperature control system for lamp annealers has been proposed which employs a radiation thermometer and which is adapted to control the lamp output by the open-loop method according to a predetermined lamp output control pattern until the temperature reaches a range wherein the radiation thermometer is usable for measurement and to thereafter control the lamp output by the closed-loop method so that the measured temperature will match a target temperature control pattern (see Unexamined Japanese Patent Publication SHO 62-98722).

When the proposed system operates for open-loop control before the temperature reaches the range permitting measurement with the radiation thermometer, the mode of rise of temperature differs, for example, with the condition of the wafer as previously stated. For this reasion, the gradient of temperature measured when the open-loop control is changed over to the closed-loop control upon the temperature reaching the range measurable with the radiation thermometer also differs depending on the condition of the wafer. If the gradient of measured temperature obtained at this time is greatly different from the gradient of the target temperature control pattern, the temperature actually measured involves a steady-state deviation from the target temperature. The sytem then fails to effect accurate control.

SUMMARY OF THE INVENTION

An object of the present invention is to provide a temperature control system for lamp annealers which is adapted for highly accurate control free from steady-state deviations.

The present invention provides a system for controlling the temperature of a lamp annealer which system comprises a group of lamps for heating an article to be heated, a radiation thermometer for measuring the temperature of the article, and a lamp output controller for controlling the output of the lamps based on the output of the radiation thermometer, the lamp output controller having stored therein a target temperature control pattern, the system being adapted to effect open-loop control by controlling the lamp output according to a predetermined lamp output control pattern until the output of the radiation thermometer reaches a specified-temperature range enabling closed-loop control and not lower than the lowest temperature measurable by the radiation thermometer, to compare the gradient of temperatures measured by the radiation thermometer with the gradient of the target temperature control pattern to determine the ratio of the former to the latter after the output of the radiation thermometer has reached the temperature range, to continue the open-loop control while the gradient ratio is smaller than a predetermined control change-over reference value, and to perform closed-loop control by controlling the lamp output after the gradient ratio has increased to not smaller than the reference value so that the temperature measured matches the target temperature control pattern.

Even after the output of the radiation thermometer has reached the temperature range enabling closed-loop control and not lower than the lower temperature measurable by the thermometer, the system continues the open-loop control by controlling the lamp output according to the predetermined lamp output control pattern while the ratio of the gradient of temperatures measured by the thermometer to the gradient of the target temperature control pattern is smaller than the control change-over reference value. After the gradient ratio has increased to not smaller than the reference value, the lamp output is controlled by closed-loop control so that the temperature measured matches the targent temperature control pattern. This feature decreases the difference between the measured temperature gradient and the gradient of the target temperature control pattern when the open-loop control is changed over to the closed-loop control, consequently diminishing the steady-state deviation of the actual temperature measurement from the target temperature to ensure temperature control with higher accuracy.

Preferably, the system is so adapted that after the output of the radiation thermometer has reached the temperature range enabling the closed-loop control, the closed-loop control is performed upon the output of the thermometer increasing to not lower than a value predetermined with respect to the target temperature even if the gradient ratio is smaller than the control change-over reference value.

BRIEF DESCRIPTION OF THE DRAWINGS

FIG. 4 is a flow chart showing an example of operation of a microcomputer included in the arithmetic device.

DESCRIPTION OF THE PREFERRED EMBODIMENT

An embodiment of the invention will be described below with reference to the accompanying drawings.

Figure 1:
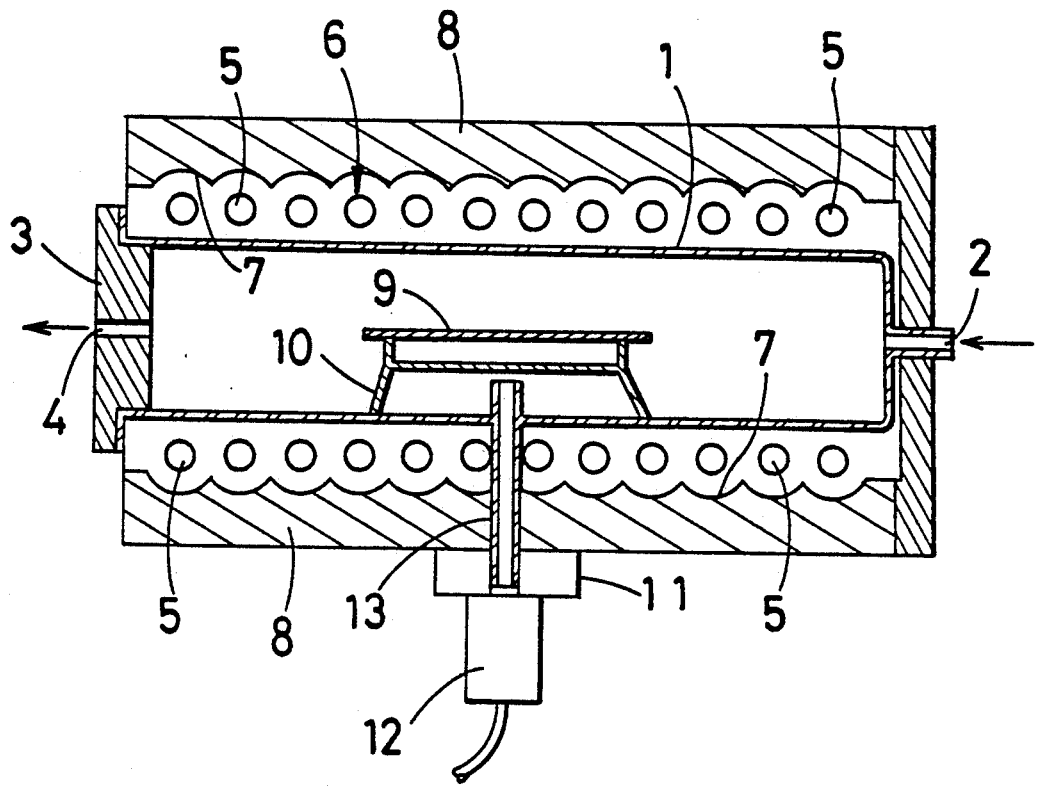
FIG. 1 is a view in vertical section of a lamp annealer.
Figure 5:
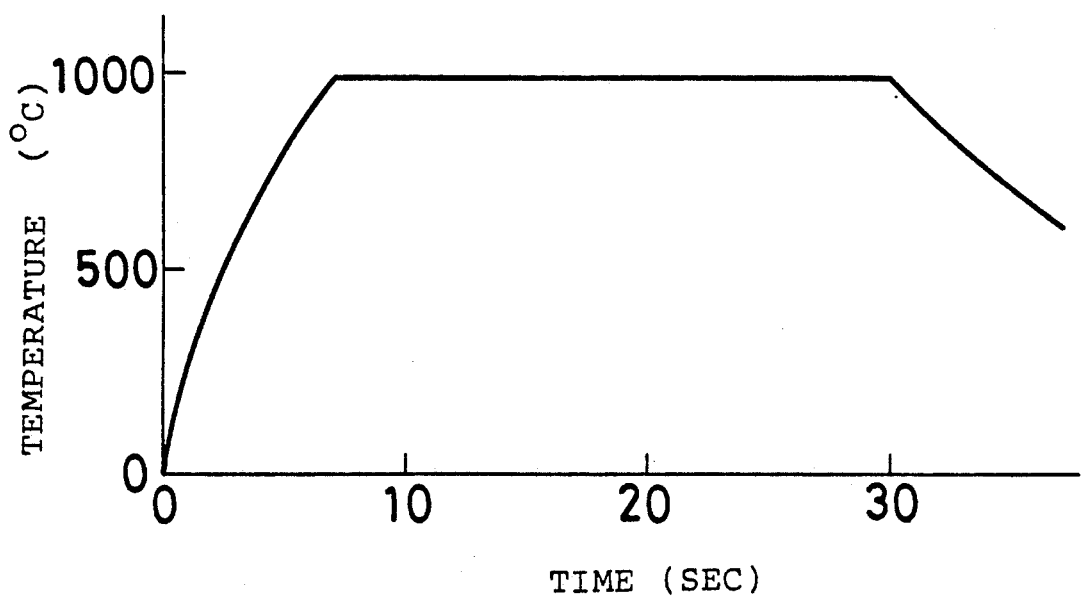
FIG. 5 is a graph showing an example of target temperature control pattern.

FIG. 1 shows the main portion of a lamp annealer as an example.

The lamp annealer has a processing tube 1 made of quartz and having a flat rectangular cross section. The tube 1 has a gas inlet 2 at its one end and is provided at the other end thereof with a closure 3 having a gas outlet 4. A plurality of halogen lamps 5 are arranged above and below the processing tube 1 to provide a lamp group 6. The lamps 5 are accommodated in lamphouses 8 having a reflector 7. A semiconductor wafer 9 is disposed on a quartz susceptor 10 positioned in the center of interior of the tube 1, and is heated by being irradiated in this state with the lamps 5.

A radiation thermometer 12 is attached by a mount 11 to the central portion of lower surface of the lower lamphouse 8. A hollow pipe 13 extends vertically from the mount 11 through the lamphouse 8 and the central portion of lower wall of the processing tube 1 into the tube 1. Through the hollow pipe 13, radiation from the wafer 9 impinges on the thermometer 12, which in turn produces an output corresponding to the temperature of the wafer 9, whereby the temperature of the wafer 9 is measured.

Figure 2:
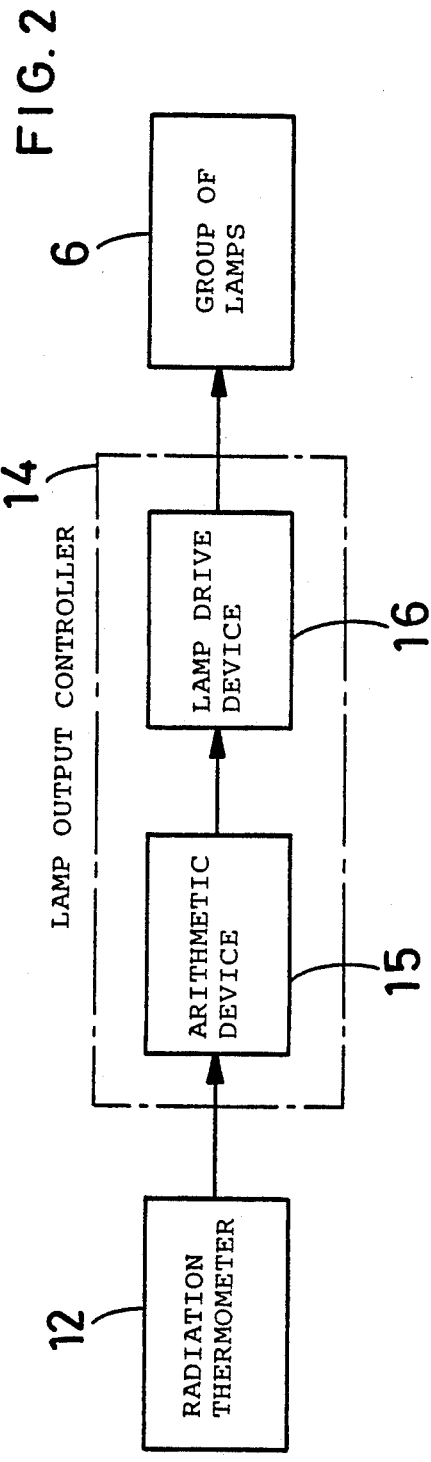
FIG. 2 is a block diagram showing an embodiment of the invention, i.e., a temperature control system for the lamp annealer.

FIG. 2 shows the construction of one embodiment of the invention, i.e., a temperature control system for the lamp annealer.

The temperature control system comprises the group 6 of lamps, the radiation thermometer 12 and a lamp output controller 14.

The lamp output controller 14 controls the output of the lamp group 6 in the following manner. Until the output of the radiation thermometer 12 reaches a predetermined temperature range enabling closed-loop control after the start of heating, the controller 14 performs open-loop control by controlling the output of the lamp group 6 according to a predetermined lamp output control pattern. After the output has reached the temperature range, the controller determines the ratio (temperature gradient ratio) of the gradient of temperatures measured by the radiation thermometer 12 (measured temperature gradient) to the gradient of a target temperature control pattern (targent temperature gradient). While the temperature gradient ratio is smaller than a predetermined control change-over reference value, the controller continues the open-loop control. After the temperature gradient ratio has increased to not smaller than the reference value, the controller performs closed-loop control by controlling the lamp output so that the temperature measured matches the target temperature control pattern.

The lower limit of the temperature range enabling closed-loop control is not lower than the lowest temperature measurable by the radiation thermometer 12 and is, for example, 300° C.

Examples of output control patterns useful for the open-loop control includes a pattern for maintaining the lamp output at a constant level, and a pattern for varying the lamp output stepwise with time.

The lamp output controller 14 comprises an arithmetic device 15 and a lamp drive device 16.

The arithmetic device 15 performs arithmetic operations and gives commands for effecting the above modes of control.

The lamp drive device 16 controls the output of the lamp group 6 in accordance with commands from the arithmetic device 15 and comprises, for example, a thyristor or triac for controlling the current to be supplied to the lamps 5.

Figure 3:
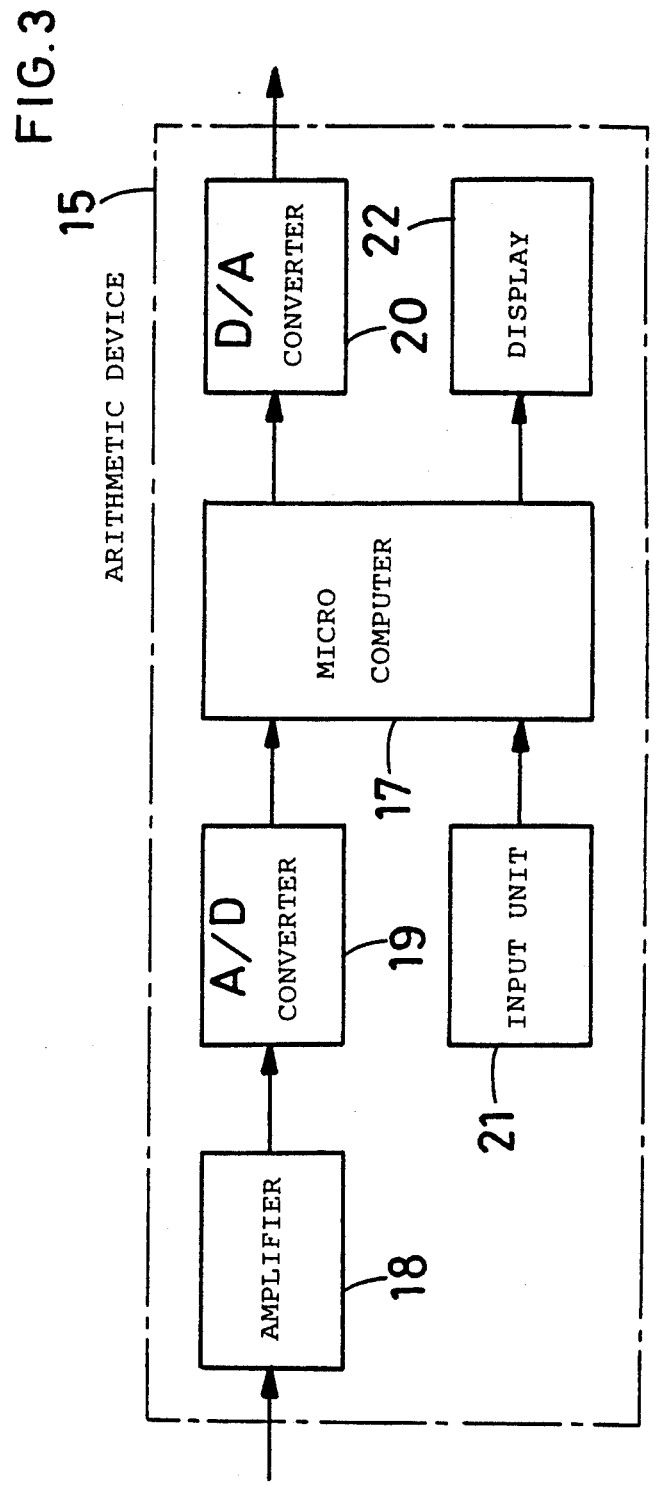
FIG. 3 is a block diagram of an arithmetic device included in the temperature control system.

FIG. 3 shows an example of construction of the arithmetic device 15.

The arithmetic device 15 comprises a microcomputer 17, amplifier 18, A/D converter 19, D/A converter 20, input unit 21 and display 22.

The output of the radiation thermometer 12 is amplified by the amplifier 18 and then fed to the A/D converter 19.

The output of the thermometer 12, as amplified by the amplifier 18, is subjected to A/D conversion by the converter 19 and then sent to the microcomputer 17.

The output of the microcomputer 17 is fed to the D/A converter 20 for D/A conversion and then to the lamp drive device 16.

The input unit 21 is used for determining and selecting the lamp output control pattern, target temperature control pattern and control parameters.

The display 22 serves to give presentation in inputting data from the input unit 21 and show the internal state of the microcomputer 17.

The microcomputer 17 has a memory for storing the lamp output control pattern, target temperature control pattern, control parameters, etc. specified by the input unit 21. Different items of data can be specified for each of these patterns or parameters and each can be selected by the input unit 21 for use. Using such items of data, the microcomputer 17 controls the lamp drive device 16 based on the output of the radiation thermometer 12.

An example of temperature control operation will be described next with reference to the flow chart of FIG.

4 showing the operation of microcomputer 17 of the arithmetic device 15.

The desired lamp output control pattern, target temperature control pattern, control parameters, etc. are specified or selected for the arithmetic device 15, and a heating start switch is depressed, whereupon open-loop control is first initiated according to the lamp output control pattern (step 1). Next, the output of the thermometer 12 is fed to the microcomputer to measure the temperature of the wafer 9 (step 2) and inquire whether the measurement is within the temperature range (at least 300° C.) enabling closed-loop control (step 3). If the inquiry of step 3 is answered in the negative, step 4 follows to elapse a predetermined control period by a timer operation. The sequence then returns to step 2. In this way, the open-loop control is performed while measuring the wafer temperature at every control period until the measured temperature reaches the temperature range enabling closed-loop control.

When the measured temperature is found to be not lower than the temperature range in step 3, step 5 inquires whether the temperature is at least 80% of a target temperature. (e.g., 1000° C.). If the answer to the inquiry of step 5 is negative, the sequence proceeds to step 6 to determine a temperature gradient ratio from a measured temperature gradient and a target temperature gradient. The measured temperature gradient can be determined from measured temperatures. The target temperature gradient can be determined by determining the gradient of the portion of the target temperature control pattern which is most approximate to the measured temperatures. The temperature gradient ratio can be obtained by determining the ratio of the measured temperature gradient thus determined to the target temperature gradient thus obtained.

Next, an inquiry is made as to whether the temperature gradient ratio is at least a predetermined control change-over reference value (e.g., 0.9) (step 7). When the answer to the inquiry of step 7 is negative, step 4 follows to elapse a control period by a timer operation. The sequence then returns to step 2. In this way, the open-loop control is performed while measuring the wafer temperature at every control period until the temperature gradient ratio increases to not lower than the reference value even after the closed-loop control enabling temperature range has been reached.

When the temperature gradient ratio is found to be not smaller than the control change-over reference value in step 7, the sequence proceeds to step 8 in which closed-loop control is performed as will be described below. First, the data of target temperature control pattern stored in the memory is searched for a point which is closest to the current temperature measurement, and this point is taken as the starting temperature for closed-loop control. The lamp output is thereafter so controlled that temperature measurements will be in match with the portion of the target temperature control pattern subsequent to the starting temperature. The closed-loop control is effected, for example, in the same manner as in the case of the aforementioned patent publication SHO 62-98722. The control process is completed by performing the closed-loop control up to the terminal point of the target temperature control pattern.

After the measured temperature has reached the closed-loop control enabling temperature range, the sequence proceeds to step 8 to perform the closed-loop control upon the measured temperature increasing to not lower than 80% of the target temperature in step 5 even if the temperature gradient ratio is smaller than the control change-over reference value. For example, in the case where the initial lamp output is small, the gradient of rise of temperature is small, and it is likely that the temperature gradient ratio will be smaller than the reference value. In such a case, step 5 is followed by step 8 to forcibly change the mode of control to the closed-loop control as stated above.

As described above, the system continues the open-loop control while the temperature gradient ratio is smaller than the control change-over reference value even after the measured temperature has reached the closed-loop control temperature range, and performs the closed-loop control after the temperature gradient ratio has increased to not smaller than the reference value. This decreases the difference between the measured temperature gradient and the gradient of the target temperature control pattern when the open-loop control is changed over to the closed-loop control, consequently diminishing the steady-state deviation of the actual temperature measured from the target temperature to ensure highly accurate temperature control.

In annealing semiconductor wafers, the temperatures significant for heat treatment are in the range of from the target temperature to {the target temperature—(100 to 200)° C}. In the case of the present embodiment, this range is 1000° to 800° C. if greatest. Although differences in the temperature change in the range of 1000° to 800° C. influence the heat treatment, differences in temperature change in the temperature range below this range exert no influence on the heat treatment. With the embodiment described, the mode of rise of temperature during the open-loop control differs, for example, with the condition of the wafer, whereas the closed-loop control alternatively performed according to the target temperature control pattern involves no difference in the temperature change. Since the open-loop control is invariably changed over to the closed-loop control before the measured temperature increases to at least 800° C., the difference in the temperature change due to the open-loop control produces no influence on the heat treatment. This ensures proper heat treatment as desired.

What is claimed is:

1. A system for controlling the temperature of a lamp annealer comprising:
    (a) a group of lamps for heating an article
    (b) a radiation thermometer for measuring the temperature of the article;
    (c) a lamp output controller for controlling the heat output of the lamps as a function of the temperature measurement of the radiation thermometer, wherein said lamp output controller comprises:
        (1) means for determining and selecting a desired target temperature control pattern and a desired lamp output control pattern;
        (2) means for storing said target temperature control pattern;
        (3) means for storing said lamp output control pattern;
        (4) means for determining a measured temperature gradient from the temperature measurements of the radiation thermometer;
        (5) means for determining a target temperature gradient from a portion of said target temperature control pattern that approximates the temperature measurements of the radiation thermometer;

(6) means for calculating a temperature gradient ratio equal to said measured temperature gradient divided by said target temperature gradient;

(7) open-loop control means for controlling the heat output of the lamps according to said lamp output control pattern when said temperature gradient ratio is smaller than a predetermined reference value; and (8) closed-loop control means for controlling the heat output of the lamps according to a comparison of the temperature measurements of the radiation thermometer with said target temperature control pattern when said temperature gradient ratio is larger than or equal to said predetermined reference value.

2. A system as defined in claim 1, wherein said closed-loop control means includes means for controlling the heat output of the lamps according to a comparison of the temperature measurements of the radiation thermometer with said target temperature control pattern when said temperature measurements are greater than or equal to a predetermined target temperature.

3. A method for controlling the temperature of a lamp annealer wherein said lamp annealer comprises:
  a) a group of lamps for heating an article;
  b) a radiation thermometer for measuring the temperature of the article; and
  c) a processor for controlling the heat output of the lamps as a function of the temperature measurement of the radiation thermometer; said method including the steps of:
    1) determining a desired target temperature control pattern;
    2) determining a desired lamp output control pattern;
    3) storing said target temperature control pattern;
    4) storing said lamp output control pattern;
    5) measuring the temperature of the article with the radiation thermometer;
    6) determining a measured temperature gradient from the temperature measurements of the radiation thermometer;
    7) determining a target temperature gradient from a portion of said target temperature control pattern that approximates the temperature measurements of the radiation thermometer;
    8) calculating a temperature gradient ratio equal to said measured temperature gradient divided by said target temperature gradient;
    9) controlling the heat output of the lamps with said processor to match said lamp output control pattern when said temperature gradient ratio is smaller than a predetermined reference value; and
    10) controlling the heat output of the lamps so that the temperature measurements of the radiation thermometer match said target temperature control pattern when said temperature gradient ratio is larger than or equal to said predetermined reference value.

4. The method of claim 3 further including the step of:
    11) controlling the heat output of the lamps so that the temperature measurements of the radiation thermometer match said target temperature control pattern when said temperature measurements are greater than or equal to a predetermined target temperature.

* * * * *